(12) United States Patent
Pepper (10) Patent No.: US 7,612,629 B2
(45) Date of Patent: Nov. 3, 2009

(54) BIASED NONLINEAR TRANSMISSION LINE COMB GENERATORS

(75) Inventor: Steven H. Pepper, Portland, OR (US)

(73) Assignee: Picosecond Pulse Labs, Boulder, CO (US)

( * ) Notice: Subject to any disclaimer, the term of this patent is extended or adjusted under 35 U.S.C. 154(b) by 263 days.

(21) Appl. No.: 11/442,499

(22) Filed: May 26, 2006

(65) Prior Publication Data

US 2007/0273454 A1 Nov. 29, 2007

(51) Int. Cl.
*H04B 3/04* (2006.01)
(52) U.S. Cl. .......................... 333/20; 333/132; 327/106
(58) Field of Classification Search ................... 333/20, 333/132; 327/106
See application file for complete search history.

(56) References Cited

U.S. PATENT DOCUMENTS

| | | | |
|---|---|---|---|
| 3,278,763 A | 10/1966 | Grove | |
| 3,629,731 A | 12/1971 | Frye | |
| 3,760,283 A | 9/1973 | Lockwood | |
| 3,768,025 A | 10/1973 | Hreha | |
| 3,909,751 A | 9/1975 | Tang et al. | |
| 4,051,450 A | 9/1977 | Barlow | |
| 4,075,650 A | 2/1978 | Calviello | |
| 4,473,807 A | 9/1984 | Weber et al. | |
| 4,487,999 A | 12/1984 | Baird et al. | |
| 4,594,557 A | 6/1986 | Shillady | |
| 4,654,600 A | 3/1987 | Lockwood | |
| 4,734,576 A | 3/1988 | Agoston et al. | |
| 4,745,445 A | 5/1988 | Mun et al. | |
| 4,750,666 A | 6/1988 | Neugebauer et al. | |
| 4,855,696 A | 8/1989 | Tan et al. | |
| 4,910,458 A | 3/1990 | Forsyth et al. | |
| 4,931,753 A | 6/1990 | Nelson et al. | |
| 4,956,568 A | 9/1990 | Su et al. | |
| 5,014,018 A | 5/1991 | Rodwell et al. | |
| 5,105,536 A | 4/1992 | Neugebauer et al. | |
| 5,157,361 A | 10/1992 | Gruchalla et al. | |
| 5,256,996 A | 10/1993 | Marsland et al. | |

(Continued)

FOREIGN PATENT DOCUMENTS

EP 0320175 A2 12/1988

(Continued)

OTHER PUBLICATIONS

Written Opinion of the International Searching Authority dated Dec. 3, 2007, International Application No. PCT/US2007/012455, International Filing Date May 25, 2007.

(Continued)

*Primary Examiner*—James Cho
(74) *Attorney, Agent, or Firm*—Klarquist Sparkman, LLP (57) ABSTRACT

Comb generators include a nonlinear transmission line (NLTL) having one or more NLTL sections. Each NLTL section includes one or more nonlinear elements and transmission line portions that provide transmission line dispersion. Typically, the nonlinear elements are Schottky diodes, and a pulse forming bias network is configured to establish Schottky diode bias conditions using a periodic signal that is input to the comb generator. For input periodic signals at frequencies between about 500 MHz and 1 GHz, output signals are produced having substantial power in frequency components at frequencies up to at least about 50 GHz.

24 Claims, 5 Drawing Sheets

U.S. PATENT DOCUMENTS

| | | | |
|---|---|---|---|
| 5,267,200 | A | 11/1993 | Tobita |
| 5,378,939 | A | 1/1995 | Marsland et al. |
| 5,479,120 | A | 12/1995 | McEwan |
| 5,506,513 | A | 4/1996 | Bacher |
| 5,519,342 | A | 5/1996 | McEwan |
| 5,679,006 | A | 10/1997 | Madelaine |
| 5,789,994 | A | 8/1998 | Case et al. |
| 5,952,727 | A | 9/1999 | Takano et al. |
| 5,956,568 | A | 9/1999 | Shiralagi et al. |
| 6,060,915 | A | 5/2000 | McEwan |
| 6,097,236 | A | 8/2000 | Tran |
| 6,097,263 | A | 8/2000 | Mueller et al. |
| 6,160,312 | A | 12/2000 | Raad |
| 6,429,822 | B1 | 8/2002 | Naudin et al. |
| 6,611,237 | B2 | 8/2003 | Smith |
| 6,628,849 | B2 | 9/2003 | Yap et al. |
| 6,670,928 | B1 | 12/2003 | Chekroun et al. |
| 6,670,958 | B1 | 12/2003 | Aleksic et al. |
| 6,690,247 | B2 | 2/2004 | Kintis et al. |
| 6,826,208 | B1 | 11/2004 | Birk |
| 6,867,668 | B1 | 3/2005 | Dagostino et al. |
| 6,900,710 | B2 | 5/2005 | Agoston et al. |
| 7,193,486 | B2 * | 3/2007 | Mrozek et al. ............... 333/20 |
| 7,462,956 | B2 * | 12/2008 | Lan et al. .................. 307/106 |
| 2002/0130734 | A1 | 9/2002 | Liang et al. |
| 2002/0145484 | A1 | 10/2002 | Agoston et al. |
| 2002/0167373 | A1 | 11/2002 | Agoston et al. |
| 2004/0039283 | A1 | 2/2004 | Banjanin et al. |

FOREIGN PATENT DOCUMENTS

| | | |
|---|---|---|
| EP | 0453744 A1 | 3/1991 |
| EP | 0753890 A2 | 1/1997 |
| GB | 2280988 | 2/1995 |

OTHER PUBLICATIONS

International Search Report, International Application No. PCT/US2007/012455, International Filing Date May 25, 2007.

Van Der Weide, "A YIG-tuned nonlinear transmission line multiplier," IEEE MTT-S Digest 2:557-560 (1993).

C. Wenzel, "New Topology Multiplier Generates Odd Harmonics," RF Design Magazine and available on the Internet at www.wenzel.com/pdffiles/RFDesign2.pdf.

C. Wenzel, "Switching Diode Frequency Doublers," available on the Internet at http://www.wenzel.com/pdffiles/diodedbl.pdf.

"Two-Diode Odd-Order Frequency Multiplier," available on the Internet at http://www.wenzel.com/documents/2diomult.html, Wenzel Associates, Inc.

M. Rodwell, "GaAs Nonlinear Transmission Lines for Picosecond Pulse Generation and Millimeter-Wave Sampling," *IEEE Trans. Microwave Theory Tech.*, 7:1194-1204 (Jul. 1991).

Boivin et al., "Receiver Sensitivity Improvement by Impulsive Coding," *IEEE Photonics Technology Letters* 9:684-686 (May 1997).

R. Levy, "New Coaxial-to-Stripline Transformers Using Rectangular Lines," *IEEE Trans. Microwave Theory Tech.*, MTT-9:273-274 (May 1961).

W.M. Grove, "Sampling for Oscilloscopes and Other RF Systems: Dc Through X-Band," *IEEE Transactions on Microwave Theory and Techniques* MTT-14:629-635 (Dec. 1966).

Merkelo et al., "Broad-Band Thin-Film Signal Sampler," *IEEE J. of Solid-State Circuits* SC-7:50-54 (Feb. 1972).

Pullela et al., "Multiplexer/Demultiplexer IC Technology for 100 Gb/s Fiber-Optic Transmission," *IEEE J. of Solid State Circuits* (Mar. 1996).

Whiteley et al., "50 GHz Sampler Hybrid Utilizing a Small Shockline and an Internal SRD," *IEEE MTT-S Digest* AA-6:895-898 (1991).

S. Allen, "Schottky Diode Integrated Circuits for Sub-Millimeter-Wave Applications," University of California (Jun. 28, 1994).

M. Case, "Nonlinear Transmission Lines for Picosecond Pulse, Impulse and Millimeter-Wave Harmonic Generation," University of California (Jul. 2, 1993).

S.T. Allen et al., "725 GHz Sampling Circuits Integrated with Nonlinear Transmission Lines," IEEE Device Research Conference (1994).

* cited by examiner

BIASED NONLINEAR TRANSMISSION LINE COMB GENERATORS

FIELD

The disclosure pertains to comb generators that include biased nonlinear transmission lines.

BACKGROUND

Testing and evaluation of microwave systems often requires the availability of a high frequency test signal. Such test signals are commonly generated using so-called "comb" generators that are configured to receive a periodic input signal and produce an output signal that can have appreciable signal power at multiple harmonics of the input signal. This output signal typically consists of a series of uniformly spaced frequency components ("pickets"), so that the output signal spectrum has an appearance like that of teeth on a comb. Conventional comb generators produce harmonics using step recovery diodes (SRDs) to generate electrical signals that are intended to approximate impulses. A bandpass filter can be provided to select one picket from the comb of frequency pickets produced by the comb generator.

Unfortunately, conventional comb generators generally accept input signals over a narrow range of frequencies and power levels, thereby limiting user selection of picket spacing and frequency span. The limited output picket spacing can make selection of a particular picket from the comb difficult. In addition, due to the manner in which SRDs produce impulse-like signals, the use of conventional comb generators can introduce substantial phase noise.

In view of these and other limitations of conventional SRD based comb generators, improved comb generators and other methods and apparatus for generating periodic high frequency signals are needed.

SUMMARY

Electrical comb generators are provided that are configured to produce a frequency comb signal in response to an input periodic signal. In typical examples, the comb generators comprise a first pulse forming bias network (PFBN) configured to receive the input periodic signal, and a nonlinear transmission line (NLTL) configured to receive the input periodic signal from the first PFBN. The NLTL includes at least two nonlinear elements, wherein the first PFBN is configured to at least partially establish a nonlinearity of the at least two nonlinear elements based on the input periodic signal. A second pulse forming bias (PFBN) network is coupled to the NLTL and configured to deliver the frequency comb signal to an output. In some examples, the first PFBN comprises an inductor coupled in series with a bias resistor and a bias capacitor, wherein a bias voltage is established on the bias capacitor based on the input periodic signal. According to some examples, the first PFBN and the second PFBN are configured to establish the nonlinearity of the at least two nonlinear elements based on the input periodic signal. In some examples, each of the first PFBN and the second PFBN comprises an inductor coupled in series with a bias resistor and a bias capacitor, wherein a bias voltage is established on the bias resistor based on the input periodic signal. In representative examples, the nonlinear elements are a first Schottky diode and a second Schottky diode, wherein the NLTL further comprises a first transmission line section coupled to deliver the input periodic signal and a bias voltage to the first Schottky diode, a second transmission line section configured to couple the first Schottky diode and the second Schottky diode, and a third transmission line section configured to couple the second Schottky diode and the second bias network.

Comb generators configured to receive an input signal and produce a frequency comb signal comprise a first pulse shaping bias network (PFBN) configured to receive the input signal and a first NLTL section coupled to the first PFBN. A second PFBN is configured to establish a nonlinearity provided by the first NLTL section based on the input signal. Additional pulse forming bias networks/NLTL stages can be provided.

Methods of generating an electrical frequency comb signal comprise providing an electrical periodic signal to a nonlinear transmission line (NLTL) and establishing a nonlinearity of the NLTL based on the periodic signal, or by independently biasing some or all stages of the NLTL. In some examples, the NLTL includes a first diode and a second diode, and the nonlinearity is associated with a bias of the first diode and the second diode. In other examples, the bias of the first and second diodes is provided in response to the periodic signal.

The foregoing and other features and advantages of the disclosed technology will become more apparent from the following detailed description, which proceeds with reference to the accompanying figures.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" means electrically or electromagnetically coupled or linked and does not exclude the presence of intermediate elements between the coupled items.

The described systems, apparatus, and methods described herein should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Disclosed embodiments of comb generators and other signal generators include nonlinear transmission lines (NLTLS) and NLTL sections. An NLTL or NLTL section generally includes one or more nonlinear elements, typically diodes configured to present a nonlinear capacitance or resistance. An NLTL also includes transmission lines or segments of transmission lines having dispersions that are selected in combination with diode nonlinearity to, for example, compress an input electrical pulse. Generally an NLTL includes a plurality of NLTL sections in which voltage dependent group delay per section decreases along a direction of propagation, but other configurations can be selected as described below.

Figure 1:
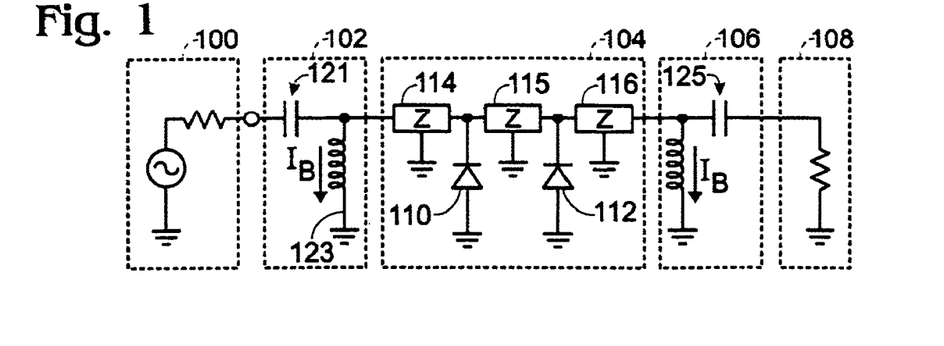
FIG. 1 is a schematic diagram of a representative nonlinear transmission line (NLTL) comb generator.

FIG. 1 illustrates a representative configuration of a biased non-linear transmission line (NLTL) harmonic generator that includes an NLTL section 104 that is coupled to a signal source 100 with an input bias section 102. The input bias section 102 is shown as a series capacitor 121 and shunt inductor 123 selected to permit a bias current $I_B$ in the inductor. Some representative bias networks are illustrated in FA-2C. The NLTL section 104 includes diodes 110, 112 and transmission line sections 114-116. The transmission line sections 114-116 can be waveguides such as, for example, microstrip waveguides, coplanar waveguides, striplines, or slotlines formed on a substrate, or transmission lines formed in cables such as coaxial or other cables. The transmission line sections 114-116 can be of similar or different constructions, and are generally selected based on a common impedance. The diodes 110, 112 are conveniently Schottky diodes, but other nonlinear devices such as other types of diodes, varactors, or varistors can be used.

In general, bias voltages or currents can be provided to one or more bias ports that can be implemented as single conductors, multiple conductors, waveguides, transmission lines, or other structures or portions thereof that are configured to deliver an electrical bias to a nonlinear element. In some examples, bias is provided with bias circuits based on resistor/capacitor/inductor networks formed of discrete components or defined as discrete structures on a circuit substrate such as circuit board or semiconductor substrate. In such examples, bias ports are provided as terminals of the bias networks.

The NLTL section 104 is coupled to an output bias section 106 that is in turn coupled to a load 108. The bias section 106 is similar to the bias section 102 except for the placement of a coupling capacitor 125. The bias sections 102, 106 are generally configured so as to avoid loading the transmission line so that only the nonlinearities of the diodes 110, 112 provide substantial loading. The comb generator of FIG. 1 can be formed with discrete components on a circuit board, defined monolithically in a semiconductor substrate, or as a hybrid circuit, or in waveguide or suspended substrate configurations.

Figure 2A:
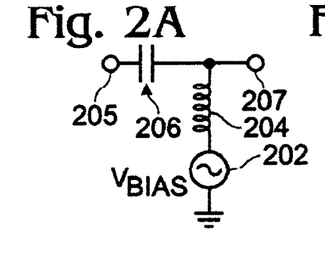
FIGS. 2A-2C are schematic diagrams of representative pulse forming bias networks for NLTLs.
Figure 2B:
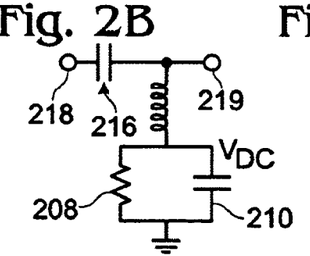
Figure 2C:
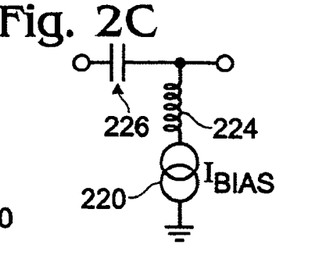

The bias sections 102, 106 are illustrative only, and in typical applications one or more of the bias networks of FIGS. 2A-2C are convenient. For example, FIG. 2A illustrates a bias network that includes a capacitor 206 and a voltage source 202 that is typically configured to provide a DC voltage $V_{DC}$ selected to establish a bias condition for the diodes 110, 112 and a bias current $I_B$ in an inductor 204. For example, the voltage $V_{DC}$ can be selected so that one or both of the diodes 110, 112 are reversed biased or forward biased. In other examples, diodes can be independently or differently biased, and additional bias networks can be provided. The associated DC bias current $I_B$ flows in the inductor 204. In some examples, the voltage source 202 can be configured to provide a time varying voltage configured to provide a time-varying bias so that an input signal encounters a bias associated with a predetermined nonlinearity. The bias can be provided with a dedicated voltage or current source, or can be derived from an input signal as shown in FIGS. 2A-2C.

Bias networks are generally provided to provide currents or voltages needed to set a bias condition for one or more NLTL stages or sections. Typically, each NLTL is independently biased with a dedicated bias network. Bias networks can also be configured to shape electrical pulses. For convenience, such networks are referred to herein as pulse forming bias networks (PFBN). Performance of any particular network as a bias network or a pulse forming network depends on network component values.

The bias section of FIG. 2A also includes an input port 205 and an output port 207 that are configured to receive an electrical signal from a signal source and couple the signal to an NLTL section. The bias section of FIG. 2A can also serve as an output bias section by connecting the output port 207 to the NLTL section and configuring the input port to serve as an output port. In both of these arrangements, input and output signals are AC coupled, while DC bias currents or voltages can be established in NLTL sections.

FIG. 2B illustrates a convenient bias arrangement that is referred to herein as a "self bias" configuration. The bias section of FIG. 2B includes a bias network that includes resistor 208 and capacitor 210 as well as a series capacitor 216 and a shunt inductor 214. An input port 218 is configured to receive an input signal and so that the capacitor 210 is charged by the input signal, and an external voltage or current source is unnecessary to bias the diodes 110, 112. In this configuration, an input voltage is clipped or rectified to produce the DC bias. Because the bias is based on the input voltage, the bias tracks the input. Thus, for a sinusoidal input voltage (or other periodic input) having a peak-to-peak voltage $V_{pp}$, the DC bias voltage can be between 0 and about $V_{pp}-V_d$, wherein $V_d$ is a typically small forward voltage associated with diode current flow. In some examples, a DC bias voltage of about $V_{pp}/2$ is derived form the input signal. An output port 219 couples the bias to the diode 110. As noted above with respect to the bias section of FIG. 2A, the same bias configuration can be used with the diode 112 by reversing input and output ports 218, 219, respectively, so that that an output signal is coupled to the load 108 via the capacitor 216.

FIG. 2C is an alternative bias section that includes a current source that establishes a bias current in an inductor 224. A capacitor 226 provides AC signal coupling.

The signal source 100 of FIG. 1 can provide a sinusoidal voltage signal or other periodic signal. In contrast to conventional pulse compressors such as described by Tan et al., U.S.

Pat. No. 4,855,696, the input signal need not be approximately matched to a soliton waveform associated with a particular stage.

Diodes, such as Schottky diodes, are convenient nonlinear elements. However, diodes can be configured to provide nonlinearity as either varactors or varistors. A diode can be referred to as a varactor if operated as a voltage variable capacitor based on a combination of an input signal and a bias signal. If operated in this manner, the diode remains primarily reverse biased. To provide a large varactor nonlinearity, a diode bias voltage can be configured so that the diode is reverse biased or slightly forward biased. When operated in this manner, diode capacitance varies over a substantial portion of the available capacitance range. Diodes can also be operated as voltage variable resistors (varistors), and nonlinear transmission lines can be configured so that the associated diodes are operated as varistors. In varistor mode operation, diode bias can be selected to provide a maximum or substantial resistance variation so that a significant nonlinearity is provided. Because signal loss is associated with current flow in the diodes, varistor based operation can exhibit significant signal attenuation, limiting the comb signal power, and mixed varistor/varactor based operation is typically preferred. In some examples, a first NLTL stage is biased to operate substantially in varistor mode, while other stages operate in varactor mode.

Figures 9, 10:
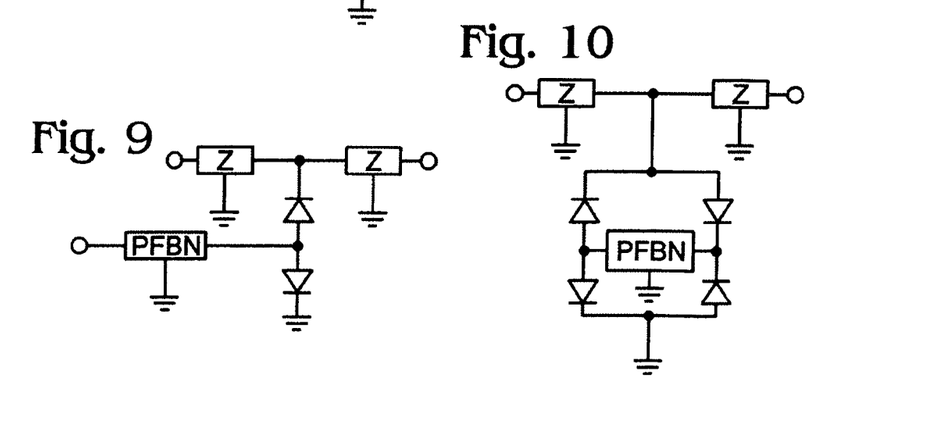
Figure 15:
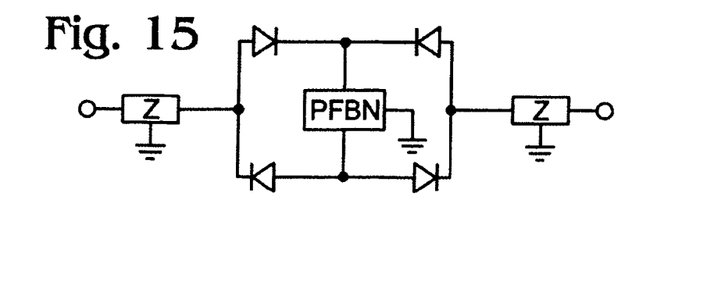

Diodes can be arranged in various ways to establish a selected nonlinearity. For example, FIG. 9 illustrates two diodes in an anti-series configuration resulting in a symmetrical capacitance/voltage (CV) characteristic in which a voltage dependent capacitance is an even function of voltage. The FIG. 9 circuit can be useful in producing odd harmonics of an input signal. FIG. 15 illustrates a four diode structure with a symmetrical CV characteristic. Other representative diode arrangements suitable for establishing a particular CV characteristic are illustrated in, for example, FIGS. 8-11 and FIGS. 13-15. Diode orientations can be reversed yielding identical operation with signal and bias polarities reversed.

Figure 3:
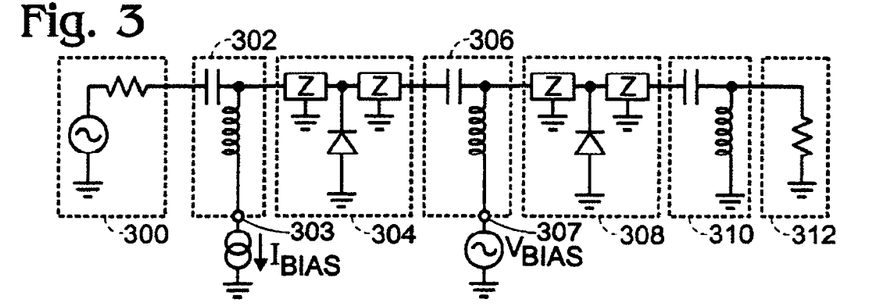
FIG. 3 is a schematic diagram of a representative nonlinear transmission line (NLTL) comb generator.

FIG. 3 illustrates a comb generator that includes first and second bias networks 302, 306 that are configured to establish bias conditions for first and second NLTL sections 304, 308, respectively. An input signal source 300 is coupled to the first pulse-forming bias network (PFBN) 302, and an output of the second NLTL 308 is coupled to a pulse forming network 310 for delivery to a load 312. As shown in FIG. 3, a bias current is applied at a bias port 303 of the bias network 302, and a bias voltage is applied at a bias port 307 of the bias network 306. In other examples, both bias networks 302, 306 can be supplied with the same or different bias currents, the same or different bias voltages, or any combination of bias currents and bias voltages. Bias voltages or currents can be provided with a single bias source, or a plurality of bias sources can be used.

Figure 4A:
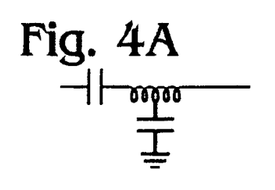
FIGS. 4A-4D are schematic diagrams of representative transmission line segments suitable for NLTLs.
Figure 4B:
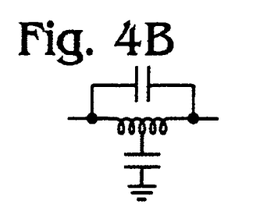
Figure 4C:
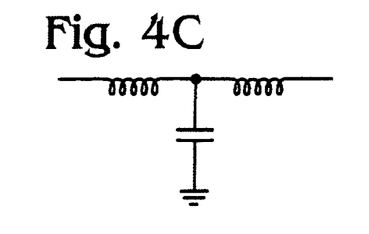
Figure 4D:
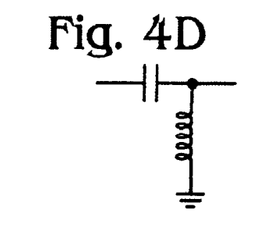
Figure 5:
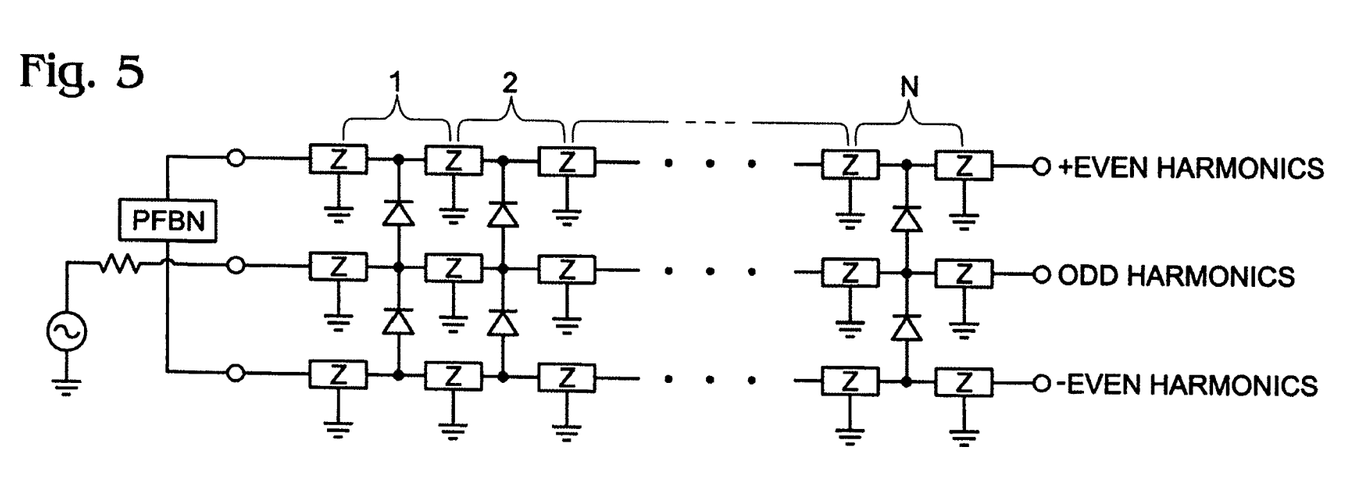
FIG. 5 is a schematic diagram of a representative nonlinear transmission line (NLTL) comb generator configured to output even harmonics at first and second output ports, and odd harmonics at a third output port. Even harmonics appear in a differential mode at the first and second output ports.

Additional examples are shown in FIGS. 5-15 in which bias networks/pulse forming networks are indicated as "PFBN" and transmission line sections are noted as "Z." Bandpass filters and additional pulse forming bias networks can be provided, but are omitted from these drawings. In these examples, diodes serve as nonlinear elements. FIGS. 4A-4C are schematic representations of various dispersive networks that can be associated with transmission line sections, otherwise provide NLTL dispersion. These examples can be configured to provide separate odd and even harmonic outputs, have single sided inputs and dual outputs, or dual inputs and a single side output, or use half wave or full wave diode configurations.

Figure 16:
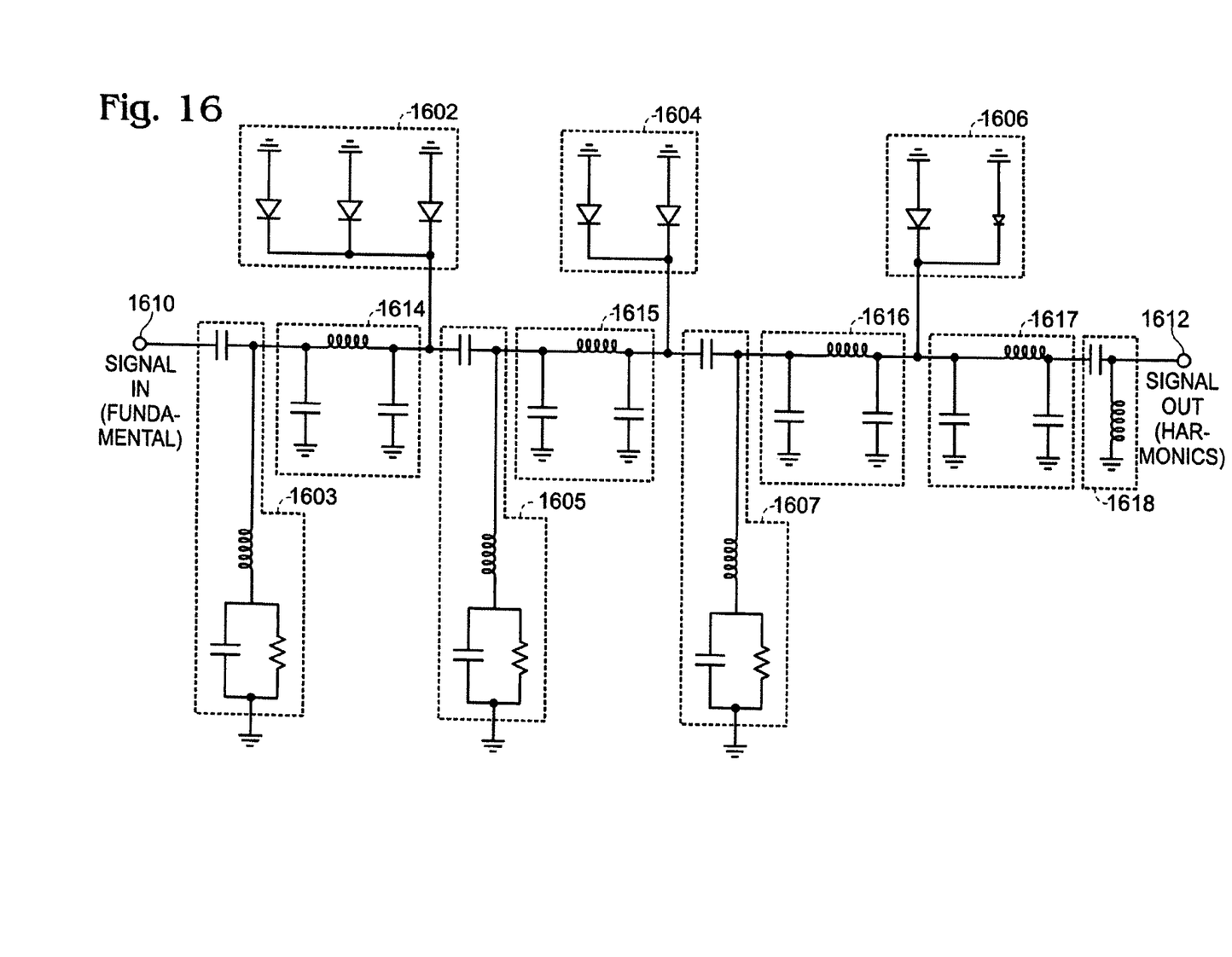
FIG. 16 is a schematic diagram of a three stage NLTL frequency quadrupler.

FIG. 16 illustrates a particular example of a three stage NLTL frequency multiplier that includes nonlinear elements 1602, 1604, 1606 coupled with dispersive elements 1614, 1615, 1616, forming three NLTL stages configured to have decreasing group delay from an input port 1610 to an output port 1612. Bias is applied to the non-linear elements 1602, 1604, 1606 with pulse forming bias sections 1603, 1605, 1607, respectively. The output port 1612 is coupled to the NLTL stage 1606 with a final (output) pulse forming bias network 1618. As shown in FIG. 16, the dispersive elements 1614-1617 include a series inductor, but other circuit configurations, such as those of FIGS. 4A-4D, can be used. While monolithic circuit configurations can be convenient, the FIG. 16 circuit can be fabricated with discrete components secured to a circuit board.

In other examples, four or more NLTL stages can be provided, and each NLTL stage (or each nonlinear element in a stage) can be independently biased. As noted above, a self-bias configuration is convenient as the user need not supply additional voltages or currents to control the NLTL stages. Self-bias can be configured to permit input signals to experience a near maximum varactor nonlinearity with a first stage bias that is about half an input peak to peak voltage. Stage bias is produced based on the input signal applied to the stage, and each stage typically receives a different input signal due to the effects of the previous stages. For convenience, such biasing is referred to as being based on the (typically) periodic signal applied to the first stage although a processed version of the first stage input signal is typically used in all stages but the first.

At least some NLTL stages can be tapered as described in, for example, Agoston et al., U.S. Pat. No. 6,900,710, which is incorporated herein by reference. Tapering can be associated with decreasing inductance, capacitance, transmission line spacing, or other electrical characteristic along a direction of propagation. In monolithic NLTL designs, waveguide and diode geometries can be conveniently decreased during fabrication to provide taper. In NLTLs that include discrete components, component values can be varied even as component dimensions remain largely unchanged. For example, inductance can be tapered by decreasing a number of coil turns while coil size remains otherwise about the same, or coil size or numbers of coils per section can be varied. Similarly, a number of diodes per section or diode size can be varied, or combination of diodes of various sizes can be used. Diode nonlinearity is generally a function of diode construction so that a selected nonlinearity can be realized by providing diodes of different construction in different NLTL sections or within one or more NLTL sections. Some suitable diode types include diodes having non-uniform doping such a linear graded doping, a uniform doping, or so-called Δ-doping in which dopant is concentrated at a particular depth. A functional dependence of relative capacitance $C(V)/C(0)$ on voltage V generally differs for these diode types. By combining different diode types, total NLTL section nonlinearity can exhibit, for example, a voltage dependence that is unavailable with one or more diodes of a single type.

Tapered NLTL stages can be used to produce a soliton-like output signal with a fixed soliton spacing that is substantially equal to an input signal period. However, to produce a frequency comb signal having appreciable signal power in a specific frequency band, one or more untapered NLTL sections can be provided so that multiple soliton-like signals are formed within an input period. For example, a first tapered NLTL stage can be used to initiate soliton formation of a first series of soliton-like pulses, and a first untapered NLTL stage used to initiate production of one or more additional series of soliton-like pulses. Additional tapered or untapered stages can be provided for further pulse compression or soliton generation. In some cases, these functions can be combined in a single NLTL stage. Comb generators of three or fewer NLTL stages typically have stages configured to perform both of these functions. Such NLTL stages are referred to herein as partially tapered. NLTL stages configured for pulse compression are referred to as tapered NLTL stages, and NLTL stages without tapering are referred to as untapered or "flat" stages.

Biased NLTL comb generators can accept input signals over a broader frequency range than conventional SRD-based comb generators. For example, input frequencies can range from a frequency $f_0$ to about 3 $f_0$. For example, a single NLTL based comb generator can be used with input signals at between at least about 500 MHz and 1.5 GHz. In addition, the disclosed NLTL based comb generators exhibit very good phase noise characteristics, and can operate with a wide range of input power levels. In contrast, conventional SRD-based comb generators operate over a limited frequency range, require input signals having signal powers within a narrow range, and introduce substantial phase noise.

Various configurations for providing NLTL stage bias are illustrated in the preceding examples. Generally each NLTL stage can be independently biased based on a common bias source, different bias sources, or in response to an input signal. NLTL stage bias can be time varying and bias can be supplied as a traveling wave bias signal. Nonlinearities in some examples are associated with diode capacitance as a function of voltage (varactor mode) or diode resistance as a function of voltage (varistor mode). In typical examples, a first NLTL stage is biased to operate in varistor mode. In varistor mode operation, diode currents can be appreciable, while in varactor mode, diode currents tend to be quite small. Each NLTL stage can have an associated PFBN, or one or more NLTL stages can share or partially share one or more PFBNs. Each NLTL stage can have a different bias, or some or all stages can have the same bias. However, depending on NLTL construction (for example, number and type of diodes), a common bias voltage does not necessarily produce the same nonlinearity in each stage.

Figure 6A:
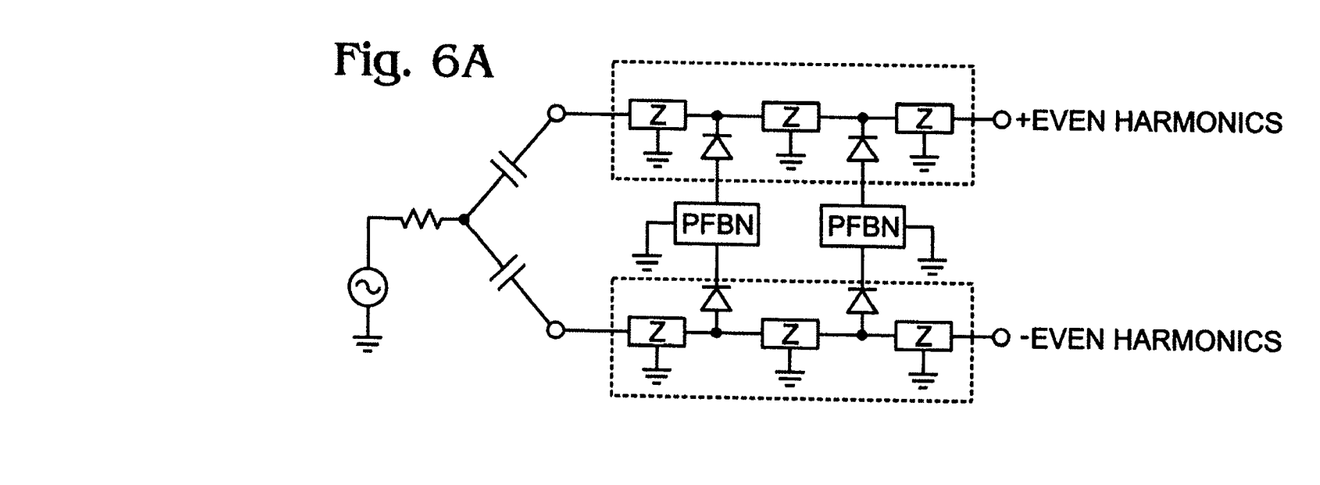
FIGS. 6-15 are schematic diagrams of additional nonlinear transmission line (NLTL) signal generators based on biased NLTLs.
Figure 6B:
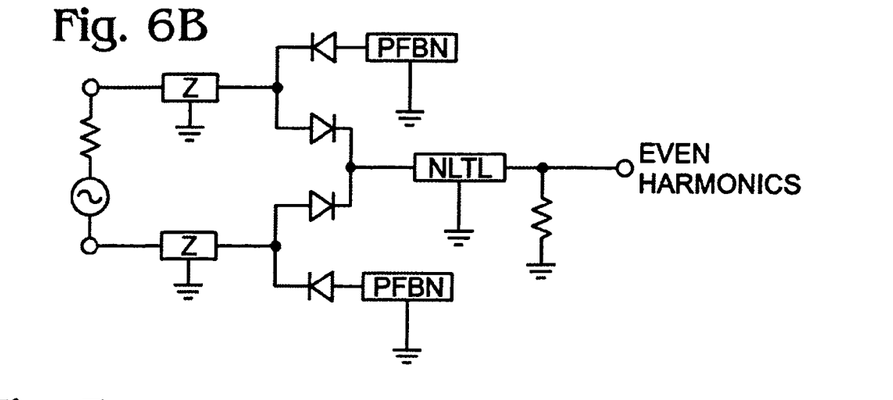
Figure 7:
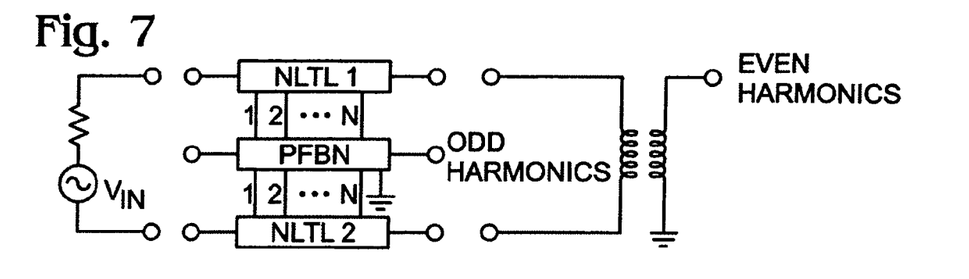
Figure 8:
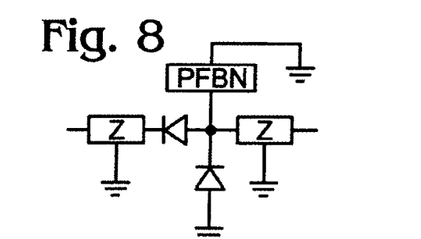
Figure 11:
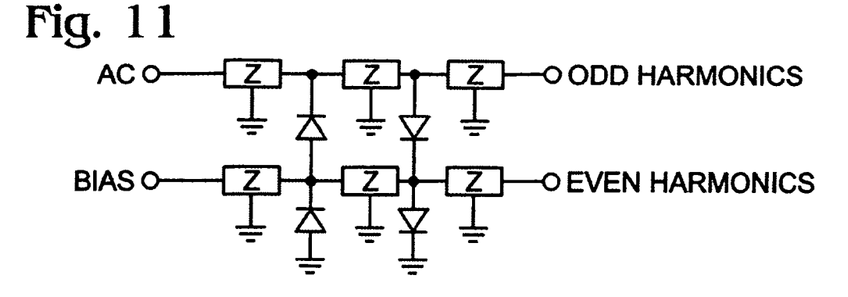
Figure 12:
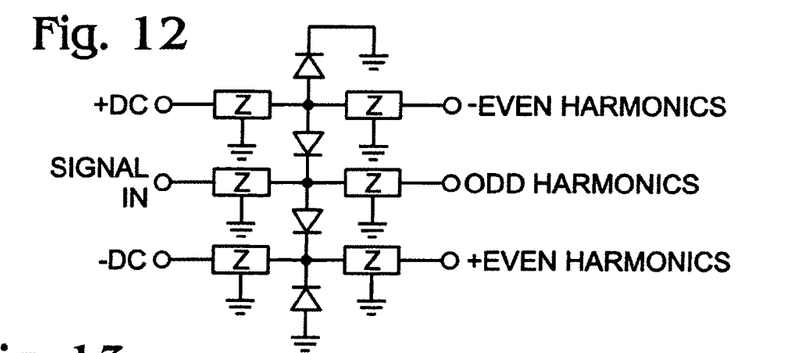
Figure 13:
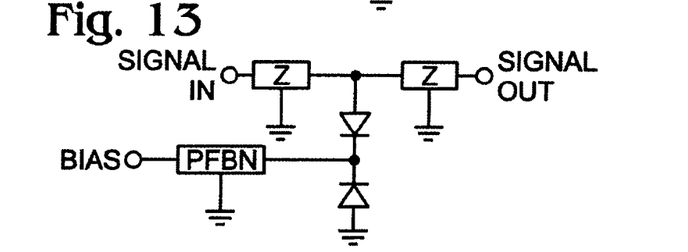
Figure 14:
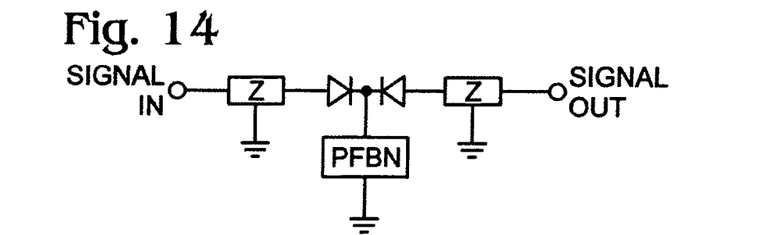

NLTL configurations can be selected to enhance or suppress generation of odd or even harmonics of a periodic input signal as shown in, for example, FIG. 6A and FIGS. 11-12. In this way, input signal power can be coupled into the desired harmonics so that output power can be increased. Delivery of either even or odd harmonics to a single output port simplifies filtering of the harmonic output to select a signal of interest.

In view of the many possible embodiments to which the disclosed principles may be applied, it should be recognized that the illustrated embodiments are only preferred examples of the invention and should not be taken as limiting the scope of the disclosure. Rather, the scope of the invention is defined by the following claims. We therefore claim as our invention all that comes within the scope and spirit of these claims.

I claim:

1. An electrical comb generator configured to produce a frequency comb signal in response to an input periodic signal, comprising:
   a first pulse forming bias network and a second pulse forming bias network; and
   a nonlinear transmission line (NLTL) configured to receive the input periodic signal, the NLTL including at least a first nonlinear element and a second nonlinear element, wherein the first and second bias pulse forming networks are configured to at least partially establish a nonlinearity of the first and second nonlinear elements, respectively.

2. The comb generator of claim 1, wherein the first and second pulse forming bias networks are configured to establish the nonlinearity of the first and second nonlinear elements in response to the input periodic signal.

3. The comb generator of claim 1, wherein the first and second pulse forming bias networks include respective bias input ports.

4. The comb generator of claim 3, wherein the bias input ports are bias input terminals.

5. The comb generator of claim 3, further comprising a bias source coupled to the input bias ports of the first and second pulse forming bias networks, wherein the nonlinearities of the first and second nonlinear elements are established in response to a bias signal provided by the bias source.

6. The comb generator of claim 3, wherein the bias signal provided by the bias source is substantially a DC voltage.

7. The comb generator of claim 3, wherein at least one of the first pulse forming bias network and the second pulse forming bias network is coupled to establish a nonlinearity of the first nonlinear element or the second nonlinear element in response to the input periodic signal.

8. The comb generator of claim 1, wherein the first pulse forming bias network comprises an inductor coupled in series with a bias resistor and a bias capacitor, wherein a bias voltage is configured to be established on the bias capacitor in response to the input periodic signal.

9. The comb generator of claim 8, wherein the first pulse forming bias network includes a capacitor configured to couple the input periodic signal to the inductor and the NLTL.

10. The comb generator of claim 1, wherein the NLTL comprises a partially tapered NLTL section.

11. The comb generator of claim 1, wherein the NLTL comprises a tapered section and an untapered section, wherein the first pulse forming bias network is configured to establish a nonlinearity in at least one of the tapered section and the untapered section.

12. The comb generator of claim 1, wherein the NLTL comprises a first NLTL section and a second NLTL section, wherein the first pulse forming bias network and the second pulse forming bias network are configured to establish nonlinearities in different NLTL sections.

13. A comb generator configured to receive an input periodic signal and produce a frequency comb, comprising:
    a first NLTL section coupled to receive the input periodic signal;
    a first pulse shaping bias network (PFBN) configured to establish a nonlinearity provided by the first NLTL section;
    a second NLTL section coupled to the first NLTL section; and
    a second pulse shaping bias network (PFBN) coupled to establish a nonlinearity provided by the second NLTL section.

14. The comb generator of claim 13, wherein the first PFBN and the second PFBN are coupled to establish the nonlinearities in response to the input periodic signal.

15. The comb generator of claim 13, further comprising:
    a third NLTL section coupled to the second NLTL section; and
    a third pulse forming bias network (PFBN) configured to establish a nonlinearity provided by the third NLTL section.

16. The comb generator of claim 15, wherein the first NLTL section is a tapered NLTL section, and at least one of the second and third NLTL sections is an untapered NLTL section.

17. The comb generator of claim 15, further comprising:
a fourth NLTL section coupled to the third NLTL section; and
a fourth pulse shaping bias network (PFBN) configured to establish a nonlinearity provided by the fourth NLTL section.

18. The comb generator of claim 17, wherein the first, second, third, and fourth PFBNs are coupled to establish the respective NLTL section nonlinearities in response to the input periodic signal.

19. The comb generator of claim 17, further comprising a bias source, wherein the first, second, third, and fourth PFBNs are coupled to the bias source to establish the respective NLTL section nonlinearities.

20. The comb generator of claim 13, wherein the first and second PFBNs include respective resistors that are configured to provide DC voltages to establish the nonlinearities of the stages.

21. The comb generator of claim 13, wherein the first NLTL section includes three diodes, and the first PFBN is coupled to provide a bias voltage to the three diodes.

22. The comb generator of claim 21, wherein the first PFBN includes a resistor configured to provide the bias voltage to the three diodes of the first NLTL section.

23. The comb generator of claim 22, wherein the second NLTL section includes two diodes, and the second PFBN is coupled to provide a bias voltage to the two diodes.

24. The comb generator of claim 23, wherein the second PFBN includes a resistor configured to provide a bias voltage to the two diodes of the second NLTL section.

* * * * *